(12) United States Patent
Hayashi (10) Patent No.: US 9,807,874 B2
(45) Date of Patent: Oct. 31, 2017

(54) WIRING SUBSTRATE, COMPONENT EMBEDDED SUBSTRATE, AND PACKAGE STRUCTURE

(71) Applicant: KYOCERA Corporation, Kyoto-shi, Kyoto (JP)

(72) Inventor: Katsura Hayashi, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 327 days.

(21) Appl. No.: 14/348,428

(22) PCT Filed: Sep. 29, 2012

(86) PCT No.: PCT/JP2012/075268
§ 371 (c)(1),
(2) Date: Mar. 28, 2014

(87) PCT Pub. No.: WO2013/047848
PCT Pub. Date: Apr. 4, 2013

(65) Prior Publication Data
US 2014/0226290 A1  Aug. 14, 2014

(30) Foreign Application Priority Data

Sep. 30, 2011 (JP) .................................. 2011-216758
Mar. 29, 2012 (JP) .................................. 2012-076761
May 14, 2012 (JP) .................................. 2012-110858

(51) Int. Cl.
*H05K 1/02* (2006.01)
*H05K 3/46* (2006.01)
(Continued)

(52) U.S. Cl.
CPC ........... *H05K 1/0271* (2013.01); *H01L 23/13* (2013.01); *H01L 23/142* (2013.01);
(Continued)

(58) Field of Classification Search
CPC ...... H05K 3/284; H05K 7/142; H05K 1/0306; H05K 1/0231; H01L 2924/01079;
(Continued)

(56) References Cited

U.S. PATENT DOCUMENTS 6,734,542 B2 *   5/2004   Nakatani ............. H01L 21/4857
                                                          174/255
2004/0053489 A1 *   3/2004   Kata .................... H01L 21/4857
                                                          438/622
(Continued)

FOREIGN PATENT DOCUMENTS

JP         7-87223 A       9/1995
JP     2002-353584 A      12/2002
(Continued)

OTHER PUBLICATIONS

Japanese Office Action with concise English explanation, Japanese Patent Application No. 2012-076761, Jul. 7, 2015, 4 pgs.
(Continued)

*Primary Examiner* — Courtney Smith
*Assistant Examiner* — Jessey R Ervin
(74) *Attorney, Agent, or Firm* — Volpe and Koenig, P.C.

(57) ABSTRACT

A wiring substrate for improving connection reliability with an electronic component, a component embedded substrate that incorporates an embedded component into the wiring substrate, and a package structure including an electronic component mounted on the wiring substrate or the component embedded substrate. The wiring substrate includes a metal plate, and a wiring layer including a plurality of insulating layers and a conductive layer arranged on the plurality of insulating layers arranged on at least one principal surface of the metal plate. The plurality of insulating layers includes a first insulating layer to contact the principal surface of the metal plate and has a larger thermal expansion
(Continued)

rate in the planar direction than the metal plate and a second insulating layer which is laminated on the first insulating layer to contact the first insulating layer and has smaller thermal expansion rate in the planar direction than the metal plate.

16 Claims, 7 Drawing Sheets (51) Int. Cl.
H01L 23/14 (2006.01)
H01L 23/498 (2006.01)
H01L 23/13 (2006.01)
H01L 23/373 (2006.01)
H01L 23/00 (2006.01)
H05K 1/18 (2006.01)
H05K 1/05 (2006.01)
H01L 23/538 (2006.01)

(52) U.S. Cl.
CPC ...... *H01L 23/3735* (2013.01); *H01L 23/3737* (2013.01); *H01L 23/49894* (2013.01); *H01L 24/19* (2013.01); *H05K 3/4655* (2013.01); H01L 23/5389 (2013.01); H01L 2224/04105 (2013.01); H01L 2224/12105 (2013.01); H01L 2224/16225 (2013.01); H01L 2224/32225 (2013.01); H01L 2224/32245 (2013.01); H01L 2224/48091 (2013.01); H01L 2224/48227 (2013.01); H01L 2224/73204 (2013.01); H01L 2224/73265 (2013.01); H01L 2224/73267 (2013.01); H01L 2924/15192 (2013.01); H01L 2924/15321 (2013.01); H05K 1/056 (2013.01); H05K 1/185 (2013.01); H05K 3/4608 (2013.01); H05K 2201/0195 (2013.01); H05K 2201/0209 (2013.01); H05K 2201/0269 (2013.01); H05K 2201/068 (2013.01)

(58) Field of Classification Search
CPC . H01L 2924/01078; H01L 2224/48091; H01L 2224/48227; H01L 2224/73265; H01L 2224/32225; H01L 2224/32245; H01L 2924/00; H01L 2924/00012; H01L 2224/04105; H01L 2224/12105; H01L 2224/16225; H01L 2224/73204; H01L 2224/73267; H01L 23/13
USPC ........ 361/748, 750, 760–763, 766, 782–784, 361/790, 795, 812; 257/773; 174/250
See application file for complete search history.

(56) References Cited

U.S. PATENT DOCUMENTS

| 2006/0204733 | A1 | 9/2006 | Murai et al. |
| 2007/0164349 | A1* | 7/2007 | Nakasato ............ H01L 21/6835 257/318 |
| 2009/0011249 | A1* | 1/2009 | Sakamoto ............ H05K 3/4688 428/428 |
| 2010/0078786 | A1* | 4/2010 | Maeda .................... H01L 23/16 257/678 |
| 2011/0215478 | A1* | 9/2011 | Yamamichi ........... H01L 23/522 257/773 |
| 2011/0316148 | A1* | 12/2011 | Kondo ................ H01L 21/4857 257/737 |
| 2012/0080788 | A1* | 4/2012 | Arai ....................... H01L 25/50 257/737 |
| 2013/0088841 | A1 | 4/2013 | Ohshima et al. |

FOREIGN PATENT DOCUMENTS

| JP | 2005-019750 A | 1/2005 |
| JP | 2006-270065 A | 10/2006 |
| JP | 2011-003841 A | 1/2011 |
| JP | 2011-159649 A | 8/2011 |
| WO | 2011/125354 A1 | 10/2011 |

OTHER PUBLICATIONS

International Search Report, PCT/JP2012/075268, Nov. 9, 2012, 2 pgs.

* cited by examiner

WIRING SUBSTRATE, COMPONENT EMBEDDED SUBSTRATE, AND PACKAGE STRUCTURE

FIELD OF INVENTION

The present invention relates to a wiring substrate for use in electronic apparatuses (for example, various audio visual devices, home electrical devices, communication devices, computer devices, and peripheral devices thereof) and the like, a component embedded substrate in which an embedded component is embedded in the wiring substrate, and a package structure in which an electronic component is mounted on the wiring substrate or the component embedded substrate.

BACKGROUND

In recent years, the heat generation amount of electronic components has further increased with high functionality of electronic components for use in electronic devices. Then, in order to efficiently dissipate the heat generated in the electronic components, a metal plate is sometimes used for a core material of the wiring substrate.

Japanese Unexamined Patent Application Publication No. 200-353584 describes a wiring substrate having a metal plate serving as a core material and a wiring layer containing resin applied to both front and back surfaces of the metal plate and a conductive layer.

In general, the coefficient of thermal expansion is different between metal and resin. When heat is applied to the wiring substrate, the thermal expansion difference in the planar direction of the metal plate and an insulator becomes large. Therefore, stress is added to the interface of the metal plate and the wiring layer, and there is a possibility that the wiring layer is separated from the metal plate due to the stress.

As a result, disconnection occurs in the conductive layer of the wiring substrate, so that the electrical reliability of the wiring substrate easily decreases. Therefore, it has been required to increase the electrical reliability of the wiring substrate.

SUMMARY

It is an object of the present invention to provide a wiring substrate which satisfies a demand for improving the electrical reliability of the wiring substrate, a component embedded substrate in which an embedded component is embedded in the wiring substrate, and a package structure in which an electronic component is mounted on the wiring substrate or the component embedded substrate.

A wiring substrate according to one aspect of the present invention has a metal plate and a wiring layer which contains a plurality of insulating layers and a conductive layer disposed on the plurality of insulating layers and which is disposed on at least one principal surface of the metal plate. The plurality of insulating layers of the wiring layer include a first insulating layer which is provided in contact with the one principal surface of the metal plate and whose coefficient of thermal expansion in the planar direction is larger than that of the metal plate and a second insulating layer which is laminated on the first insulating layer in such a manner as to contact the first insulating layer and whose coefficient of thermal expansion in the planar direction is smaller than that of the metal plate. The first insulating layer contains resin. The second insulating layer contains a plurality of first particles which are formed with an inorganic insulating material and are bound to each other, and a part of the first insulating layer is disposed in the spaces of the plurality of first particles.

According to the wiring substrate of one aspect of the present invention, the electrical reliability of the wiring substrate can be improved.

DETAILED DESCRIPTION OF THE PREFERRED EMBODIMENTS

First Embodiment

<Wiring Substrate>

Hereinafter, the wiring substrate according to the first embodiment of the present invention is described with reference to FIG. 1 to FIG. 3.

Figure 1:
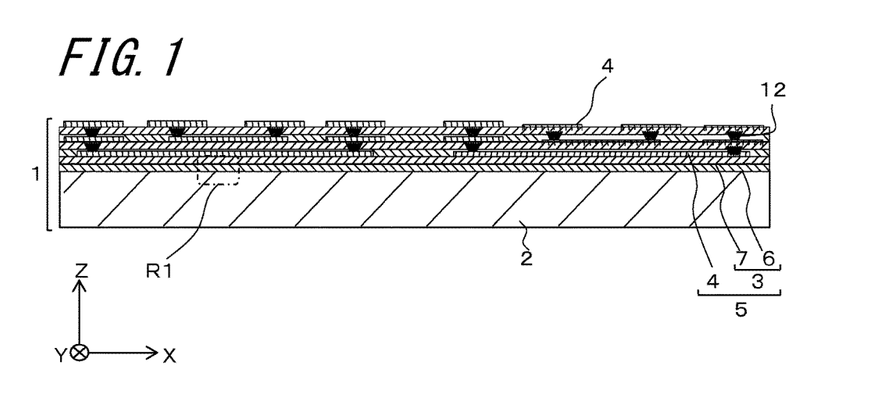
FIG. 1 is a cross sectional view of a wiring substrate according to a first embodiment of the present invention.

The wiring substrate 1 illustrated in FIG. 1 has a metal plate 2 and a plurality of wiring layers 5 which are provided only on one principal surface of the metal plate 2 and have a plurality of insulating layers 3 and a conductive layer 4.

The metal plate 2 is formed with, for example, a high heat-conductive metal, such as copper, aluminum, or an alloy thereof, and functions as a heat dissipation member for dissipating the heat generated from an electronic component to be provided on the wiring substrate 1 and also functions as a support member of the wiring layer 5. In the metal plate 2, since the end surfaces are exposed, heat is favorably dissipated from the end surfaces.

In the wiring substrate 1 in this embodiment, the wiring layer 5 is provided only on one principal surface of the metal plate 2 and the other principal surface of the metal plate 2 is exposed to an atmosphere. Therefore, there is no substance blocking the heat transfer between the other principal surface and the outside, so that heat is favorably dissipated to the outside from the other principal surface, and thus an outstanding effect of improving the heat dissipation efficiency is demonstrated.

In the metal plate 2, the thermal conductivity is set to, for example, 50 W/m·K or more and 430 W/m·K or less and the coefficient of thermal expansion in each direction is set to 14 ppm/° C. or more and 25 ppm/° C. or less.

The thermal conductivity is measured by a measurement method according to JISC2141-1992 by a laser flash method, for example. The coefficient of thermal expansion is measured by a measurement method according to JISK7197-1991 using a commercially available TMA (Thermo-Mechanical Analysis) device.

Two or more (three layers in this embodiment) of the wiring layers 5 are laminated on one principal surface of the above-described metal plate 2 and each wiring layer 5 has two or more of the insulating layers 3 and the conductive layer 4 disposed on the plurality of insulating layers 3. Specifically, the wiring layer 5 has a configuration in which a first insulating layer 6, a second insulating layer 7, and the conductive layer 4 are laminated in this order from the metal plate 2 side. The lamination number of the wiring layers 5 is not limited insofar as the number is one or more.

Figure 2:
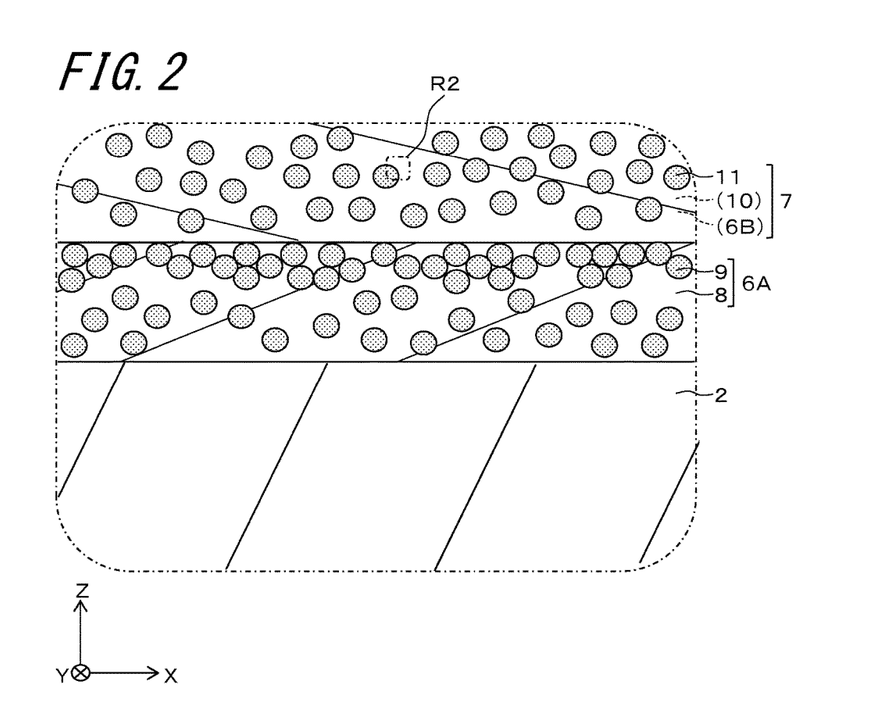
FIG. 2 is an enlarged cross sectional view of an R1 portion of FIG. 1.
Figure 3:
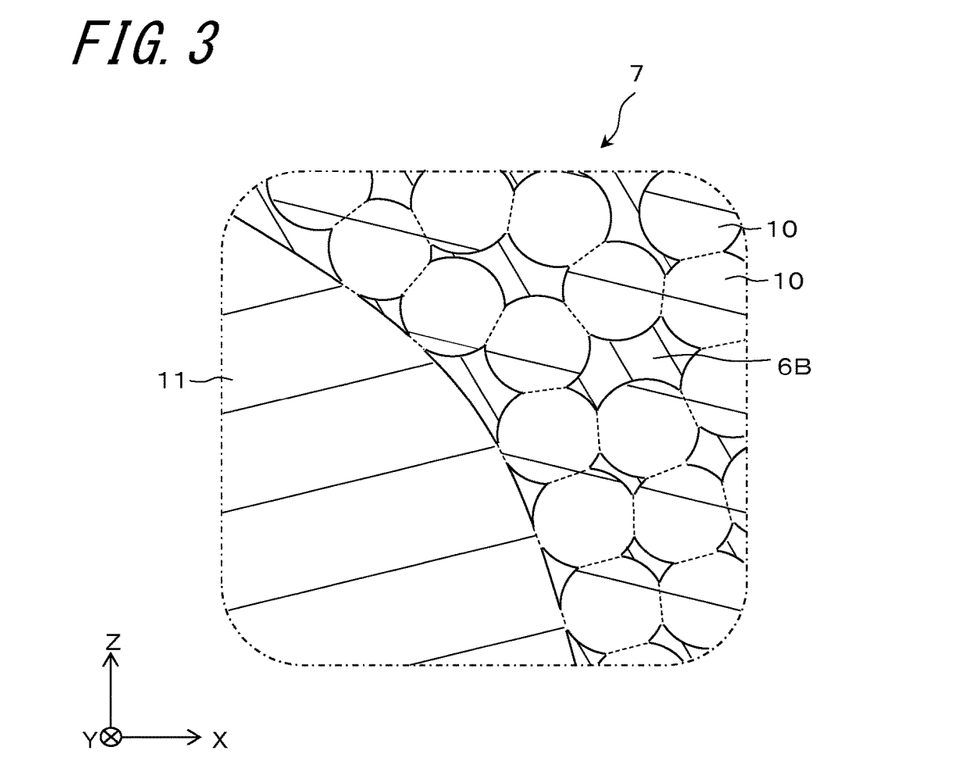
FIG. 3 is an enlarged cross sectional view of an R2 portion of FIG. 2.

The first insulating layer 6 has a layer region 6A and a filling portion 6B which is disposed on the principal surface of the layer region 6A and fills the spaces in the second insulating layer 7 described later as illustrated in FIG. 2 and FIG. 3. The layer region 6A achieves insulation of the metal plate 2 and the conductive layer 4 and adhesion of the metal plate 2 and the second insulating layer 7 and the filling portion 6B improves the adhesiveness of the first insulating layer 6 and the second insulating layer 7.

The first insulating layer 6 contains resin 8 as the main component. As a resin material constituting the resin 8, epoxy resin, polyimide resin, acrylic resin, cyanate resin, fluororesin, silicone resin, polyphenylene ether resin, bismaleimide triazine resin, or the like is mentioned, for example. The coefficient of thermal expansion in each direction of the first insulating layer 6 is set to 20 ppm/° C. or more and 50 ppm/° C. or less and the Young's modulus is set to 0.5 GPa or more and 5 GPa or less, for example. The Young's modulus is measured using, for example, Nano Indentor XP/DCM manufactured by MTS systems corporation.

The first insulating layer 6 further contains filler particles 9 dispersed in the resin 8 while being coated with the resin 8 and formed with an inorganic insulating material. The inorganic insulating material constituting the filler particles 9 includes, for example, silicon oxide, aluminum oxide, magnesium oxide, calcium oxide, or the like. Among the above, it is particularly desirable to use silicon oxide from the viewpoint of a low coefficient of thermal expansion. The particle diameter of the filler particles 9 is 0.5 μm or more and 5 μm or less, for example.

In the first insulating layer 6 adjacent to the metal plate 2, a larger number of the filler particles 9 are contained in a region on the side of the second insulating layer 7 than in a region on the side of the metal plate 2. As a result, by bringing the coefficient of thermal expansion of the region on the side of the second insulating layer 7 in the first insulating layer 6 close to the coefficient of thermal expansion of the second insulating layer 7, the thermal stress resulting from a difference in the coefficient of thermal expansion of the first insulating layer 6 and the second insulating layer 7 can be reduced and the separation of the first insulating layer 6 and the second insulating layer 7 can be reduced. By bringing the coefficient of thermal expansion of the region on the side of the metal plate 2 in the first insulating layer 6 close to the coefficient of thermal expansion of the metal plate 2, the thermal stress resulting from a difference in the coefficient of thermal expansion of the first insulating layer 6 and the metal plate 2 can be reduced and the separation of the first insulating layer 6 and the metal plate 2 can be reduced.

In the case where the first insulating layer 6 is divided to two parts in such a manner that the thickness is equal to each other, and then a part closer to the second insulating layer 7 is defined as a first region and a part closer to the metal plate 2 is defined as a second region, 55% or more and 70% or less, for example, of the filler particles 9 contained in the first insulating layer 6 are located in the first region and 30% or more and 45% or less, for example, of the filler particles 9 contained in the first insulating layer 6 are located in the second region. This can be confirmed in the cross section along the thickness direction of the first insulating layer 6.

The second insulating layer 7 contains a large number of particles formed with an inorganic insulating material whose coefficient of thermal expansion is smaller than that of the resin material of the first insulating layer 6. The particles have first particles 10 and second particles 11 whose particle diameter is larger than that of the first particles 10. The particle diameter of the first particles 10 is 3 nm or more and 110 nm or less, for example and the particle diameter of the second particles 11 is 0.5 μm or more and 5 μm or less, for example.

Such first particles 10 and second particles 11 are disposed in such a manner that a large number of the first particles 10 with a smaller particle diameter are charged into the spaces between the second particles 11. Then, as illustrated in FIG. 2 and FIG. 3, the charged first particles 10 are bound to each other and also the second particles 11 and a large number of the first particles 10 disposed around the second particles 11 are bound to each other, so that the second particles 11 are made to adhere to each other through a large number of the first particles 10.

The binding of the first particles 10 or the binding of the first particles 10 and the second particles 11 are achieved in such a manner that the outer regions of the particles are partially combined while holding the particle shape to a certain degree and the combined portion forms a neck structure. This binding manner is different in the binding state from the binding manner as in general sintering of ceramics in which ceramic particles grow in such a manner as to extinguish the spaces of the particles, and then the grown particles are bound to each other with a large part of the surface. In this embodiment, the spaces between a large number of the particles in the second insulating layer 7 do not disappear by the binding of a large number of the particles and remain between a large number of the combined particles while holding the particle shape to a certain degree in the second insulating layer 7. The spaces are combined to each other and form a net shape, for example, in a three dimensional view.

In the spaces between the particles in the second insulating layer 7, the filling portion 6B of the first insulating layer 6 described above is present. The filling portion 6B adheres to the first particles 10 or the second particles 11. Thus, the first insulating layer 6 adheres not only to the principal surface of the second insulating layer 7 but to the internal surface of the spaces of the second insulating layer 7, which increases the adhesion area of the first insulating layer 6 and the second insulating layer 7, so that the first insulating layer 6 and the second insulating layer 7 firmly adhere to each other. As a result, in the case where heat is applied to the wiring substrate 1, even when the first insulating layer 6 with a larger thermal expansion coefficient than the metal plate 2 attempts to thermally expand, the thermal expansion is favorably suppressed by the second insulating layer 7 with a smaller thermal expansion coefficient, so that the thermal expansion coefficient becomes smaller than that of the first insulating layer 6. Therefore, a difference in the thermal expansion between the wiring layer 5 and the metal plate 2 becomes small, and the thermal stress in the interface thereof is eased, so that the separation of the metal plate 2 and the plurality of wiring layers 5 can be favorably suppressed.

The second insulating layer 7 has spaces of 35% by volume or less and the spaces are filled with a part of the resin 8 of the first insulating layer 6. Thus, a part of the first insulating layer 6 is disposed in the spaces between the plurality of first particles 10 in the second insulating layer 7. The first particles 10 and the second particles 11 occupy 65% by volume or more of the second insulating layer 7. Among the first particles 10 and the second particles 11, the first particles 10 are contained in a proportion of 20% by volume or more and 40% by volume or less and the second particles 11 are contained in a proportion of 60% by volume or more and 80% by volume or less. The inorganic insulating material constituting the first particles 10 and the second particles 11 includes silicon oxide, aluminum oxide, magnesium oxide, calcium oxide, or the like, for example. Among the above, it is desirable to use silicon oxide from the viewpoint of a low coefficient of thermal expansion. The coefficient of thermal expansion in each direction of the second insulating layer 7 formed with the materials is set to 0.6 ppm/° C. or more and 3 ppm/° C. or less and the Young's modulus thereof is set to 100 GPa or more and 150 GPa or less, for example.

The second insulating layer 7 contains the second particles 11 whose particle diameter is larger than that of the first particles 10. Therefore, even when a crack generated by the breakage of the binding of the first particles 10 reaches up to the second particles 11, the crack extends in such a manner as to divert along the surface of the second large particles 11 with a larger particle diameter. Therefore, high energy is required for the extension of the crack. As a result, the extension of the crack can be reduced, so that the breakage of the second insulating layer 7 can be favorably prevented.

The first particles 10 and the second particles 11 may be formed with the same material or different materials. However, the formation with the same material is preferable because the binding of the particles becomes strong and cracks generated in the second insulating layer 7 are suppressed.

The conductive layer 4 is partially disposed on each second insulating layer 7 and is formed with a conductive material, such as copper, for example. The conductive layers 4 of the respective wiring layers 5 are disposed with an interval in the thickness direction and the upper and lower conductive layers 4 are electrically connected through via conductors 12. The conductive layer 4 and the via conductors 12 are formed with a conductive material, such as lead, tin, silver, gold, copper, zinc, bismuth, indium, or aluminum, for example. The via conductor 12 is not formed in the wiring layer 5 adjacent to the metal plate 12, which results in the fact that the conductive layer 4 and the metal plate 2 are electrically insulated.

<Method for Manufacturing Wiring Substrate>

Next, a method for manufacturing the wiring substrate 1 described above is described with reference to FIG. 4.

Figure 4:
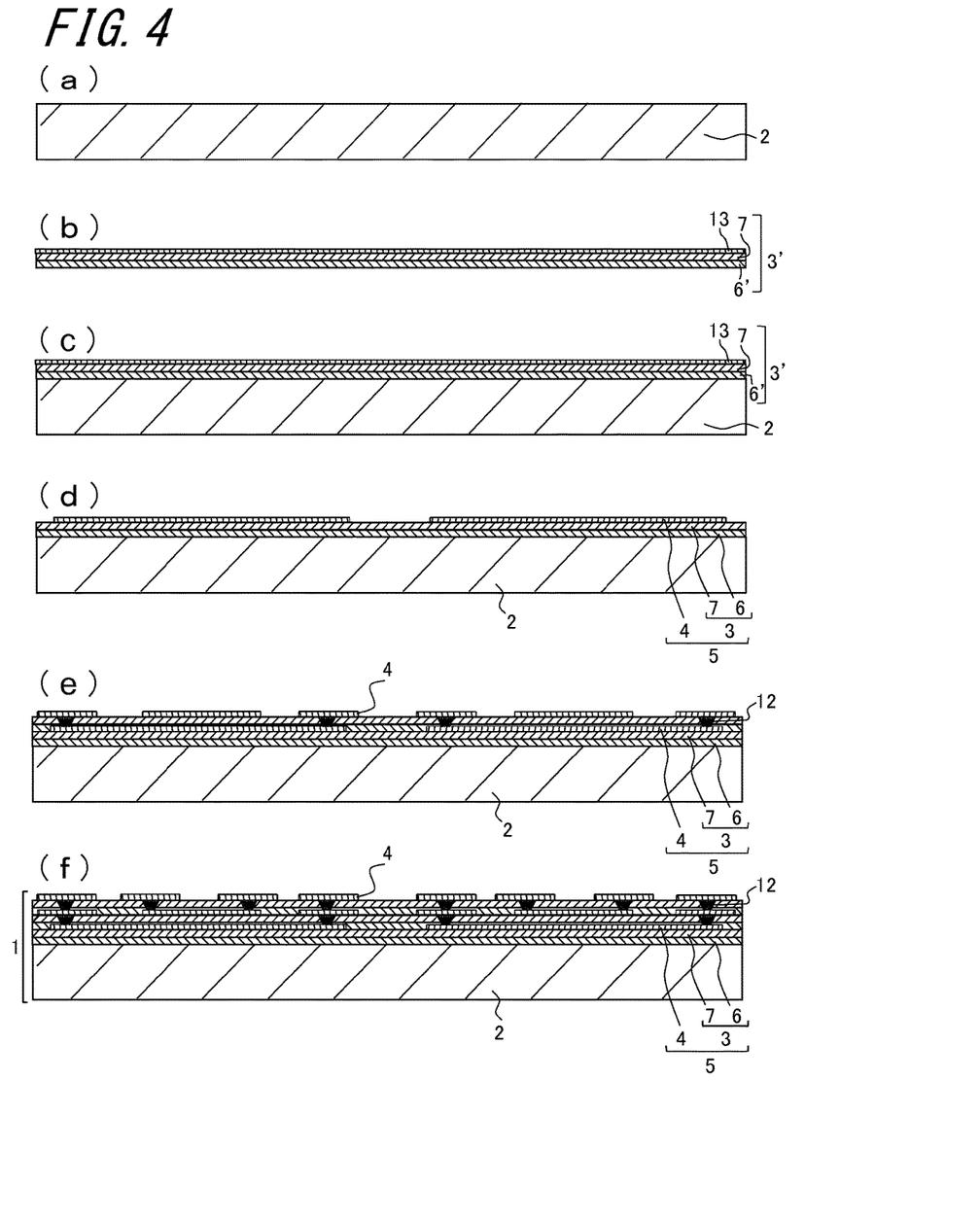
FIG. 4 includes cross sectional views illustrating a manufacturing process of the wiring substrate illustrated in FIG. 1.

(1) First, the metal plate 2 is prepared as illustrated in FIG. 4(a).

The metal plate 2 is produced by processing a plate body containing, for example, a high heat-conductive material, such as copper or aluminum, as appropriate.

In order to increase the adhesion strength of the metal plate 2 and a plurality of lamination sheets 3', the surface of the metal plate 2 may be roughened. The roughening of the metal plate 2 surface is performed by forming minute irregularities in the surface of the metal plate 2 with an etching solution or the like containing formic acid as the main component, for example.

(2) Next, the lamination sheet 3' containing the second insulating layer 7, an uncured resin sheet 6' corresponding to the first insulating layer 6, and a conductive support 13 which supports them is prepared as illustrated in FIG. 4(b).

The lamination sheet 3' is produced by the following method. First, an inorganic insulating material sol containing a large number of the first particles 10 and the second particles 11 is applied onto a conductive support media 13, such as copper foil, and then the inorganic insulating material sol is heated at 150° C. to 230° C. for 2 hours, for example, to dry the inorganic insulating material sol, whereby the second insulating layer 7 is formed on the support 17. Since the inorganic insulating material sol contains a large number of the first particles 10 whose particle diameter is set in a small range of 110 nm or less, for example, the atoms on the surface of the first particles 10 are activated with heat of about 150° C. to 230° C., so that the first particles 10 and the second particles 11 are bound to each other and the first particles 10 are bound to each other. Thus, the second insulating layer 7 in which the particles are firmly combined is formed. Inside the second insulating layer 7, spaces are formed between the particles.

On the other hand, in order to separately prepare the resin sheet 6', a varnish in which an uncured resin is melted in a solvent is applied onto a PET film, and then the varnish is dried to thereby form the resin sheet 6' in the shape of the PET film. The uncured state refers to a state of A-stage or B-stage according to ISO472:1999.

Then, the resin sheet 6' is pasted in such a manner as to contact the second insulating layer 7 by a vacuum laminator, a roll laminator, or vacuum press, for example, and thereafter, the PET film is separated from the resin sheet 6', whereby the lamination sheet 3' is produced. In the pasting process, by pressurizing the resin sheet 6' during pasting the same and also heating the resin sheet 6' at a temperature at which an uncured resin is not thermally cured (less than the polymerization initiation temperature of the resin), the uncured resin of the resin sheet 6' is fluidized, and then the fluidized uncured resin is charged into the spaces of the second insulating layer 7.

In the charging, since the width of the filler particles 9 contained in the resin sheet 6' is larger than the width of the spaces of the second insulating layer 7, the filler particles 9 are not charged into the spaces of the second insulating layer 7 and are near the interface with the second insulating layer 7. Therefore, since the resin sheet 6' is formed into the first insulating layer 6 as described later, the first insulating layer 6 contains a large number of the filler particles 9 on the second insulating layer 7 side than on the side opposite to the second insulating layer 7.

(3) Next, both the principal surfaces of the laminate are heated under pressure in a state where the lamination sheet 3' is laminated on one principal surface of the metal plate 2 as illustrated in FIG. 4(c).

The lamination sheet 3' is laminated in such a manner that the resin sheet 6' contacts the metal plate 2.

The heating is performed at a temperature of 170° C. to 220° C., for example, and the resin sheet 6' is thermally cured by the heating. The uncured resin on one principal surface of the metal plate 2 forms the layer region 6A of the first insulating layer 6 and the uncured resin charged into the spaces of the second insulating layer 7 forms the filling portion 6B of the first insulating layer 6.

(4) Next, as illustrated in FIG. 4(d), the conductive layer 4 is formed on the second insulating layer 7 to thereby form the wiring layer 5 containing the first insulating layer 6, the second insulating layer 7, and the conductive layer 4.

The conductive layer 4 is formed into a predetermined pattern by a known semiadditive method, a known subtractive method, or the like after removing the conductive support 13 from the second insulating layer 7. The conductive layer 4 may be formed into a predetermined pattern by patterning the conductive support 13 by a known photolithographic technique, a known etching technique, or the like.

(5) Thereafter, as illustrated in FIGS. 4(e) and 4(f), the wiring layer 5 is successively laminated by successively repeating the processes (2) to (4). The via conductors 12 for electrically connecting the conductive layers 4 which are separated from each other are formed in the wiring layer 5.

The via conductor 12 is formed by irradiating the first insulating layer 6 and the second insulating layer 7 with laser light by, for example, a YAG laser device or a carbon dioxide laser device to form a via hole which penetrates the first insulating layer 6 and the second insulating layer 7 at the timing between the process (3) and the process (4) above, and then attaching a conductive material to the inside of the via hole by a known semiadditive method, a known subtractive method, or the like when forming the conductive layer 4 in the process (4) above.

The wiring substrate 1 is produced through the above-described processes.

<Package Structure>

Figure 5:
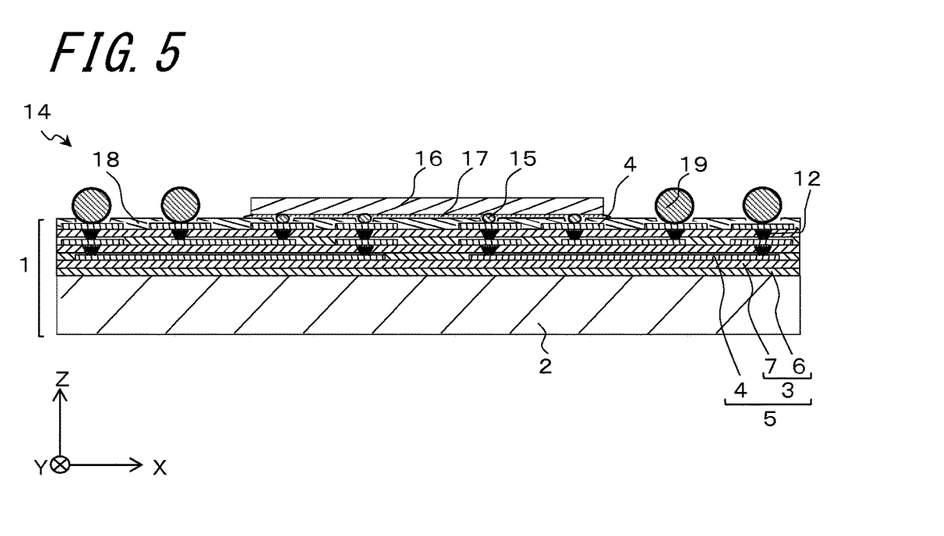
FIG. 5 is a cross sectional view of a package structure according to the first embodiment of the present invention.

Next, a package structure in which an electronic component is mounted on the wiring substrate illustrated in FIG. 5 is described.

A package structure 14 has a wiring substrate 1, an electronic component 16 mounted on one principal surface (principal surface opposite to a metal plate 2) of the wiring substrate 1 through first solder balls 15, and an underfill 17 disposed between the wiring substrate 1 and the electronic component 16.

In the package structure 14 of this embodiment, a solder resist layer 18 is formed in such a manner as to expose a part of the conductive layer 4 on the wiring layer 5 disposed on the outermost layer on the side opposite to the metal plate 2 in the wiring substrate 1. On the conductive layers 4 exposed from the solder resist layer 18, the above-described first solder balls 15 or second solder balls 19 for connecting with a mother board are disposed. The solder resist layer 18 suppresses wetting and spreading of the first and second solder balls 15 and 19 on the conductive layers 4 when mounting an electronic component on a wiring substrate 1A and when mounting the wiring substrate 1A on the mother board and favorably prevents adhesion of solder to the conductive layers 4 other than a desired portion.

For the electronic component 16 mounted on the wiring substrate 1, a semiconductor element, such as an LSI or a memory chip, is used, for example. The electronic component 16 is mounted on the wiring substrate 1 by flip-chip mounting or the like through the plurality of first solder balls 15, for example.

The underfill 17 is charged into the spaces between the wiring substrate 1 and a first electronic component 16 and protects the connection surface of the wiring substrate 1 and the first electronic component 16 and is formed with a resin material, such as epoxy resin or polyimide resin, for example.

Second Embodiment

<Package Structure>

Figure 6:
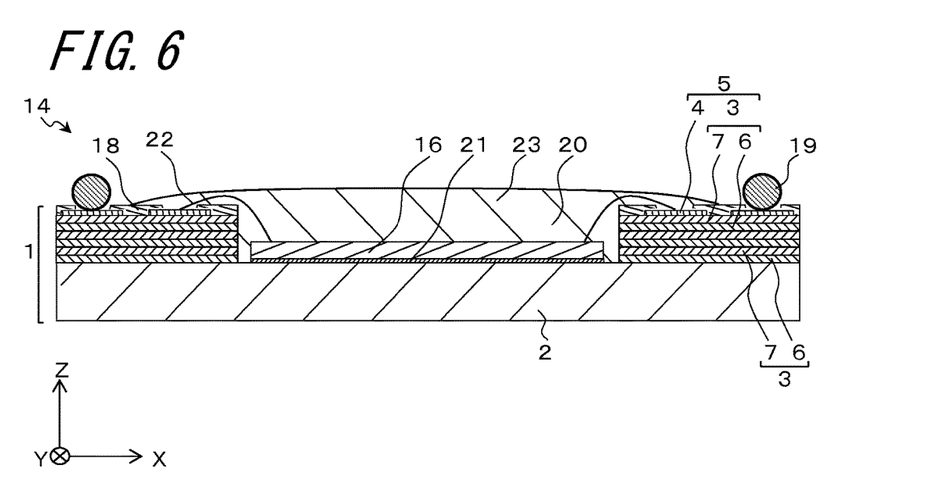
FIG. 6 is a cross sectional view of a package structure according to a second embodiment of the present invention.

Hereinafter, a package structure according to a second embodiment of the present invention is described with reference to FIG. 6. A description of the same configuration as that of the first embodiment described above is omitted.

A package structure 14 of the second embodiment has a wiring substrate 1 having a concave portion 20 which opens to one principal surface (principal surface opposite to the metal plate 2) and an electronic component 16 which is mounted by wire bonding in the concave portion 20.

The concave portion 20 penetrates each wiring layer 5 of the wiring substrate 1 in the thickness direction and is exposed with a part of the upper surface of the metal plate 2 as the bottom surface. Since the electronic component 16 is mounted on the bottom surface of the concave portion 20, the wiring layer 5 is not present between the electronic component 16 and the metal plate 2. Therefore, the heat dissipation properties of the electronic component 16 by the metal plate 2 can be improved.

The electronic component 16 is fixed in the concave portion 20 by the adhesion to the bottom surface of the concave portion 20 through an adhesive 21. As the adhesive 21, it is preferable to use a high heat-conductive adhesive in which about 50% by volume to 70% by volume of metal powder, such as silver or copper, is charged into resin.

On the other hand, the electronic component 16 is electrically connected to the conductive layer 4 formed on one principal surface of the wiring substrate 1 through a bonding wire 22 containing a metal material, such as gold or copper, for example. The conductive layer 4 is contained in the wiring layer 5 located on the outermost layer opposite to the metal plate 2. The other wiring layers 5 in this embodiment contain only the insulating layer 3 but the other wiring layers 5 may have the conductive layer 4.

To the conductive layers 4 formed on one principal surface of the wiring substrate 1, the bonding wire 22 or the second solder ball 19 is connected.

The inside of the concave portion 20 is filled with a sealing resin 23, such as epoxy resin. The sealing resin 23 partially protrudes from the concave portion 20 to cover the bonding wires 22 inside the concave portion 20 and outside the concave portion 20. As a result, the oxidization of the bonding wires 22 can be suppressed.

The above-described wiring substrate 1 of the second embodiment can be produced by forming a plurality of wiring layers 5 on one principal surface of the metal plate 2 in the same manner as in the processes (1) to (5) of the first embodiment, and then forming the concave portion 20 which penetrates the plurality of wiring layers 5 in the thickness direction to expose a part of one principal surface of the metal plate 2 using laser processing or sandblast processing, for example.

Third Embodiment

<Package Structure>

Figure 7:
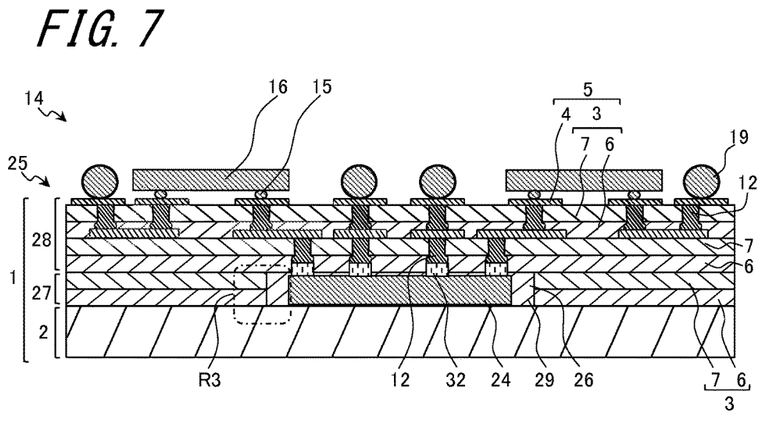
FIG. 7 is a cross sectional view of a package structure according to a third embodiment of the present invention.
Figure 8:
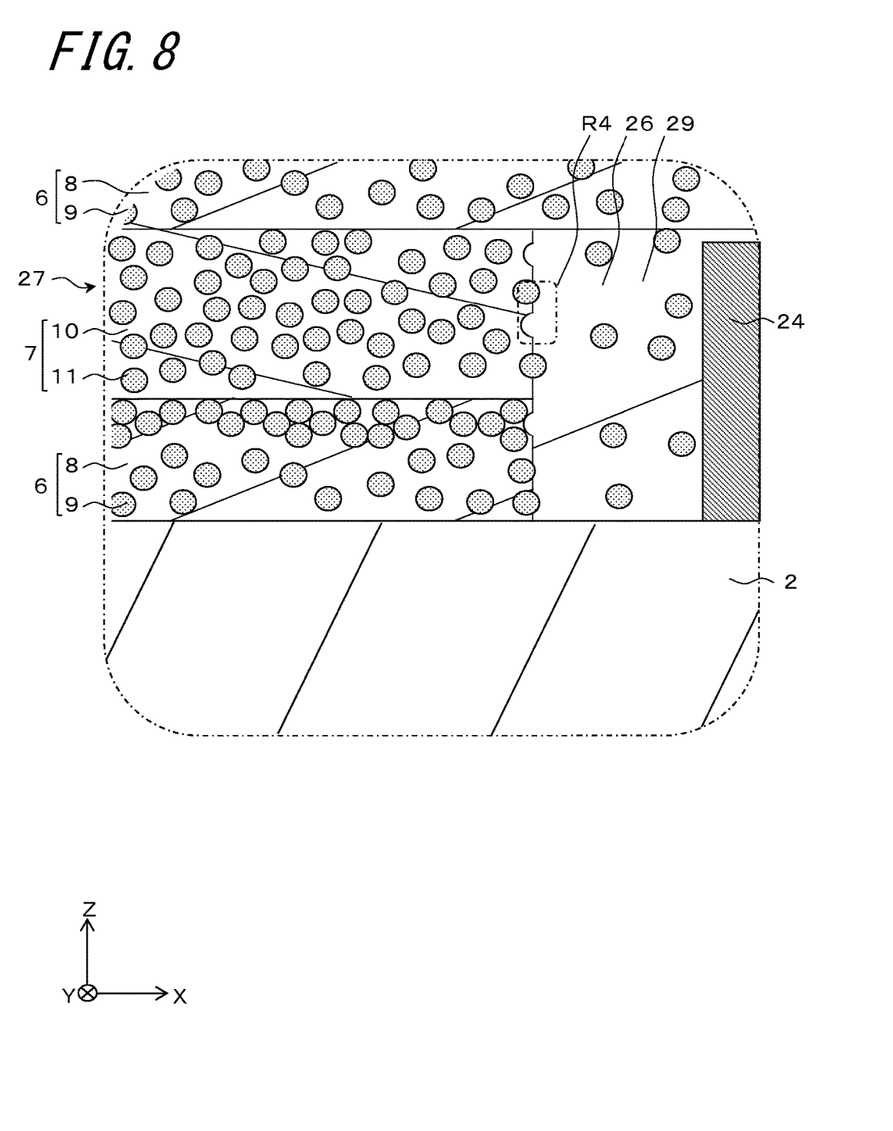
FIG. 8 is an enlarged cross sectional view of an R3 portion of FIG. 7.

Hereinafter, a package structure according to a third embodiment of the present invention is described with reference to FIG. 7 to FIG. 9. A description of the same configuration as that of the first and second embodiments described above is omitted.

A package structure 14 of a third embodiment has a component embedded substrate 25 having a wiring substrate 1 and an embedded component 24 embedded in the wiring substrate 1 and an electronic component 16 mounted on one principal surface (principal surface opposite to the metal plate 2) of the component embedded substrate 25. In the wiring substrate 1, first solder balls 15 or second solder balls 19 are connected onto conductive layers 4 formed on one principal surface of the component embedded substrate 25 in the same manner as in the first embodiment.

The wiring substrate 1 contains a first substrate 27 constituted by at least a single-layer wiring layer 5 and disposed on one principal surface of the metal plate 2 and a second substrate 28 constituted by at least a single-layer wiring layer 5 and disposed on the first substrate 27. In the first substrate 27, a penetration hole 26 along the thickness direction is formed. One opening of the penetration hole 26 is covered with the metal plate 2 and the other opening is covered with the second substrate 28.

In the penetration hole 26, the embedded component 24 is accommodated. The embedded component 24 is disposed on one principal surface of the metal plate 2. Therefore, the heat generated from the embedded component 24 can be favorably dissipated to the outside from the metal plate 2, so that the accumulation of the heat in the component embedded substrate 25 is suppressed and a malfunction of the embedded component 24 can be suppressed. The embedded component 24 may be in contact with one principal surface of the metal plate 2 or may adhere to one principal surface of the metal plate 2 through the adhesive 21 of the second embodiment.

The inside of the penetration hole 26 is filled with a filling resin 29 fixing the embedded component 24. As a resin material constituting the filling resin 29, epoxy resin, birmaleimide triazine resin, or cyanate resin can be used. It is preferable that the filling resin 29 is formed by a part of the first insulating layer 6 adjacent to the first substrate 27 in the second substrate 28 entering into the penetration hole 26. As a result, the adhesion strength of the first substrate 27 and the second substrate 28 is increased by the anchor effect, and the separation can be reduced.

Figure 9:
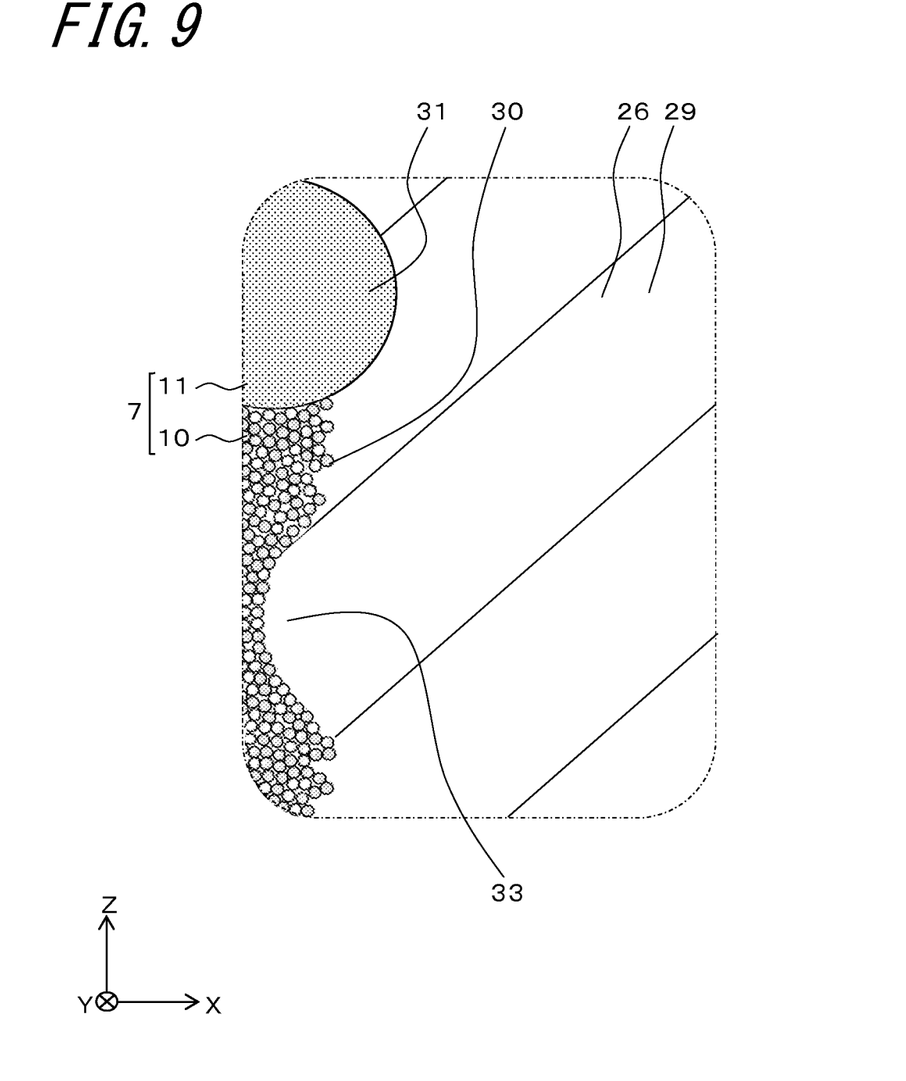
FIG. 9 is an enlarged cross sectional view of an R4 portion of FIG. 8.

As illustrated in FIG. 9, it is desirable for the end surfaces of the second insulating layer 7 exposed to the inner wall of the penetration hole 26 in the first substrate 27 to have a plurality of first convex portions 30 formed by the protrusion of the first particles 10. As a result, the adhesion strength of the filling resin 29 and the inner wall of the penetration hole 26 is increased by the anchor effect, and the separation can be reduced.

Moreover, as illustrated in FIG. 9, it is desirable for the end surfaces of the second insulating layer 7 exposed to the inner wall of the penetration hole 26 in the first substrate 27 to have a plurality of second convex portions 31 obtained by the protrusion of the second particles 11. As a result, the adhesion strength of the filling resin 29 and the inner wall of the penetration hole 26 is increased by the anchor effect, and the separation can be reduced. When a depression portion 33 which is mainly formed with the second particles 11 and comparable in size to the second convex portion 31 is formed in the inner wall of the penetration hole 26, a more favorable anchor effect can be obtained, so that the adhesion strength of the filling resin 29 and the inner wall of the penetration hole 26 is increased, and the separation can be reduced.

For the embedded component 24, a semiconductor element, such as an LSI or a power device, is used, for example. The embedded component 24 has exterior electrodes 32 on one principal surface (principal surface opposite to the metal plate 2). The exterior electrodes 32 are connected to the via conductors 12 provided in the second substrate 28 and are electrically connected to the first solder balls 15 or the second solder balls 19 through the via conductors 12 and the conductive layer 4.

The component embedded substrate 25 of the third embodiment described above can be produced as follows.

First, the first substrate 27 is formed on one principal surface of the metal plate 2 in the same manner as in the processes (1) to (5) of the first embodiment, and then the penetration hole 26 which penetrates the first substrate 27 in the thickness direction to expose a part of one principal surface of the metal plate 2 is formed using laser processing or sandblast processing. Next, the embedded component 24 is disposed in the penetration hole 26. Thereafter, the processes (2) to (4) are repeated to thereby form the second substrate 28 on the first substrate 27. In this case, the filling resin 29 may be formed by a part of the resin sheet 6' to be laminated on the first substrate 27 entering into the penetration hole 26, for example.

As described above, the component embedded substrate 25 can be produced. By forming the penetration hole 26 using laser processing or sandblast processing, the first convex portion 30, the second convex portion 31, and the depression portion 33 described above can be formed.

The present invention is not limited to the embodiments described above and can be variously altered and modified without deviating from the scope of the present invention.

For example, although the embodiments described above describe the configuration in which the wiring layer 5 is provided only on one principal surface of the metal plate 2 as an example, the wiring layer 5 may be provided on both the principal surfaces of the metal layer 2 to form the wiring substrate 1 into a metal core substrate. Moreover, the wiring substrate 1 may be used for a three-dimensional package structure, such as a PoP structure.

Moreover, although the embodiments described above describe the package structure in which the electronic component 16 which is a semiconductor element, such as an LSI or a memory chip, for example, is mounted on the wiring substrate 1 as an example, the package structure may be used as a light emitting element by the use of a light emitting element, such as LED, as the electronic component 16. In this case, by constituting the top surface of the wiring substrate 1 with the second insulating layer 7, the reflectance of visible light can be increased and the luminous efficiency of the light emitting device can be increased.

In the embodiments described above, the conductive support 13 is used for the lamination sheet 3', a support, such as a PET film, may be used in place of the conductive support 13.

REFERENCE SIGNS LIST

1 Wiring substrate
2 Metal plate
3 Insulating layer
3' Lamination sheet
4 Conductive Layer
5 Wiring layer
6 First insulating layer
6' Resin sheet
6A Layer region
6B Filling portion
7 Second insulating layer
8 Resin
9 Filler particle
10 First particle
11 Second particle
12 Via conductor
13 Conductive support
14 Package structure
15 First solder ball
16 Electronic component 17 Underfill
18 Solder resist Layer
19 Second solder ball
20 Concave portion
21 Adhesive
22 Bonding wire
23 Sealing resin
24 Embedded component
25 Component embedded substrate
26 Penetration hole
27 First substrate
28 Second substrate
29 Filling resin
30 First convex portion
31 Second convex portion
32 Exterior electrode
33 Depression portion

What is claimed is:

1. A wiring substrate, comprising:
a metal plate; and
a wiring layer comprising a plurality of electrically insulating layers and a conductive layer disposed on the plurality of electrically insulating layers and disposed on at least one principal surface of the metal plate, wherein
the plurality of electrically insulating layers of the wiring layer comprise
a first electrically insulating layer which is provided in contact with the one principal surface of the metal plate and whose coefficient of thermal expansion in a planar direction is larger than that of the metal plate and
a second electrically insulating layer which is laminated on the first electrically insulating layer and contacts the first electrically insulating layer and whose coefficient of thermal expansion in the planar direction is smaller than that of the metal plate,
the first electrically insulating layer contains resin, and
the second electrically insulating layer contains a plurality of first particles which are formed of an inorganic electrically insulating material and are bound to each other, and a part of the first electrically insulating layer is disposed in spaces between the plurality of first particles.

2. The wiring substrate according to claim 1, wherein the wiring layer is disposed only on the one principal surface of the metal plate.

3. The wiring substrate according to claim 1, wherein the second electrically insulating layer further contains a plurality of second particles whose particle diameter is larger than that of the plurality of the first particles and which are formed of an inorganic electrically insulating material and are bound to each other through the plurality of the first particles.

4. The wiring substrate according to claim 1, wherein a thickness of the second electrically insulating layer is smaller than a thickness of the first electrically insulating layer.

5. A package structure, comprising:
the wiring substrate according to claim 1; and
an electronic component mounted on the wiring layer of the wiring substrate.

6. A component embedded substrate, comprising:
the wiring substrate according to claim 1; and
an embedded component embedded in the wiring substrate.

7. The component embedded substrate according to claim 6, wherein
a penetration hole which penetrates in a thickness direction is formed in the first electrically insulating layer and the second electrically insulating layer; and
the embedded component is accommodated in the penetration hole and disposed on the principal surface of the metal plate.

8. A package structure, comprising:
the component embedded substrate according to claim 6; and
an electronic component mounted on a second principal surface opposite to the principal surface on which the metal plate is disposed of the component embedded substrate.

9. A wiring substrate, comprising:
a metal plate; and
a wiring layer comprising a plurality of electrically insulating layers and a conductive layer disposed on the plurality of electrically insulating layers and disposed on at least one principal surface of the metal plate, wherein
the plurality of electrically insulating layers of the wiring layer comprise
a first electrically insulating layer which contains resin as a main component and which is provided in contact with the one principal surface of the metal plate and whose coefficient of thermal expansion in a planar direction is larger than that of the metal plate,
a second electrically insulating layer which is laminated on the first electrically insulating layer and contacts the first electrically insulating layer and whose coefficient of thermal expansion in the planar direction is smaller than that of the metal plate,
wherein the first electrically insulating layer further contains filler particles, and
wherein the first electrically insulating layer is divided to two parts in such a manner that thicknesses of the two parts are equal to each other, wherein a part of the two parts closer to the second electrically insulting layer is defined as a first region and a part closer to the metal plate is defined as a second region, and wherein a larger number of the filler particles are contained in the second region than in the first region.

10. The wiring substrate according to claim 9, wherein the wiring layer is disposed only on the one principal surface of the metal plate.

11. The wiring substrate according to claim 9, wherein the second electrically insulating layer further contains a plurality of second particles whose particle diameter is larger than that of the plurality of the first particles and which are formed of an inorganic electrically insulating material and are bound to each other through the plurality of the first particles.

12. The wiring substrate according to claim 9, wherein a thickness of the second electrically insulating layer is smaller than a thickness of the first insulating layer.

13. A package structure, comprising:
the wiring substrate according to claim 9; and
an electronic component mounted on the wiring layer of the wiring substrate.

14. A component embedded substrate, comprising:
the wiring substrate according to claim 9; and
an embedded component embedded in the wiring substrate.

15. The component embedded substrate according to claim 14, wherein
- a penetration hole which penetrates in a thickness direction is formed in the first electrically insulating layer and the second electrically insulating layer; and
- the embedded component is accommodated in the penetration hole and disposed on the principal surface of the metal plate.

16. A package structure, comprising:
- the component embedded substrate according to claim 14; and
- an electronic component mounted on a second principal surface opposite to the principal surface on which the metal plate is disposed of the component embedded substrate.

* * * * *